(12) United States Patent
Jeong et al.

(10) Patent No.: US 7,473,590 B2
(45) Date of Patent: Jan. 6, 2009

(54) SEMICONDUCTOR DEVICE HAVING BODY CONTACT THROUGH GATE AND METHOD OF FABRICATING THE SAME

(75) Inventors: Jae-Hun Jeong, Gyeonggi-do (KR); Hoon Lim, Seoul (KR); Hoo-Sung Cho, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 372 days.

(21) Appl. No.: 11/177,447

(22) Filed: Jul. 7, 2005

(65) Prior Publication Data
US 2006/0019434 A1    Jan. 26, 2006

(30) Foreign Application Priority Data
Jul. 23, 2004   (KR) .................. 10-2004-0057862

(51) Int. Cl.
*H01L 21/00* (2006.01)
(52) U.S. Cl. .................. 438/151; 438/149; 438/152; 438/155; 257/E21.002
(58) Field of Classification Search ............ 438/149, 438/151, 152, 155
See application file for complete search history.

(56) References Cited

U.S. PATENT DOCUMENTS

| 5,545,584 | A * | 8/1996 | Wuu et al. .............. 438/152 |
| 5,689,127 | A | 11/1997 | Chu et al. |
| 6,022,766 | A | 2/2000 | Chen et al. |
| 6,093,597 | A * | 7/2000 | Hayashi .................. 438/238 |
| 6,252,280 | B1 | 6/2001 | Hirano |
| 6,514,809 | B1 | 2/2003 | Xiang |
| 6,521,948 | B2 | 2/2003 | Ebina |
| 6,979,846 | B2 * | 12/2005 | Yagishita et al. ......... 257/288 |
| 7,232,762 | B2 * | 6/2007 | Chang et al. ............. 438/694 |

FOREIGN PATENT DOCUMENTS

| KR | 10-0233626 | 9/1999 |
| KR | 10-0265080 | 6/2000 |
| KR | 2001-0015148 | 2/2001 |

\* cited by examiner

*Primary Examiner*—Michael Trinh
*Assistant Examiner*—Christy L Novacek
(74) *Attorney, Agent, or Firm*—Marger Johnson & McCollom, P.C.

(57) ABSTRACT

According to an embodiment of the invention, a lower transistor is formed on a semiconductor substrate, and an upper thin film transistor is formed on the lower transistor. A body contact plug is formed to penetrate an upper gate electrode of the upper thin film transistor and a body pattern, and to electrically connect with a lower gate electrode of the lower transistor. The body contact plug uses a contact hole to apply an electrical signal to the upper gate electrode of the upper thin film transistor, so additional volume is not necessary. Since the upper gate electrode is electrically connected to the body pattern through the body contact plug, the floating body effect of the upper thin film transistor can be improved. Therefore, a semiconductor device is provided with the high performance required to realize a highly-integrated semiconductor device.

21 Claims, 8 Drawing Sheets

SEMICONDUCTOR DEVICE HAVING BODY CONTACT THROUGH GATE AND METHOD OF FABRICATING THE SAME

CROSS-REFERENCE TO RELATED APPLICATION

This application claims priority from Korean Patent Application No. 2004-0057862, filed Jul. 23, 2004, the disclosure of which is hereby incorporated herein by reference in its entirety as if set forth fully herein.

BACKGROUND OF INVENTION

1. Technical Field

The present invention relates to a semiconductor device, and more particularly, to a semiconductor device having a body contact through a gate, and a method of fabricating the same.

2. Discussion of the Related Art

Semiconductor devices require high integration density, low threshold voltage (Vth), high operating speed, and low power consumption. This allows electronic products that employ such semiconductor devices to be light weight and small. A semiconductor device generally uses a discrete device such as a MOS transistor for a switching element. Stacking a plurality of transistors within the limited areas on a semiconductor substrate is a way of achieving high integration. A method of stacking transistors includes forming a first transistor on the semiconductor substrate, forming an insulating layer covering the first transistor, and then forming a second transistor on the insulating layer. However, there are many problems involved with the technology of stacking transistors, as now discussed.

Semiconductor devices having transistors stacked on a semiconductor substrate are disclosed in U.S. Pat. No. 6,022,766, titled "Semiconductor structure incorporating thin film transistors and methods for its manufacture", to Chen et al.

FIG. 1 is a cross-sectional view illustrating the structure of stacked transistors according to Chen et al.

Referring to FIG. 1, a thin film transistor is formed on a bulk transistor, which in turn is formed on a single crystal silicon substrate. Further, an interlayer dielectric layer and a cap oxide layer 189 are sequentially stacked between the bulk transistor and the thin film transistor. The thin film transistor includes a body layer disposed on the cap oxide layer 189. The body layer is divided into source/drain regions 190A, 190B and a channel region 196. A gate electrode 194A is disposed on the channel region 196. A gate insulating layer 192 is interposed between the gate electrode 194A and the body layer. An upper insulating layer 198 is formed to cover the overall surface of the semiconductor substrate having the gate electrode 194A.

Plugs 182, 184 are disposed on the source/drain regions of the bulk transistor. One of the source/drain regions of the bulk transistor is electrically connected to one of the source/drain regions 190A, 190B of the thin film transistor through the plug 182 and an interfacial cap 188A formed on the plug 182.

The body layer of the thin film transistor is formed by first forming an amorphous silicon layer on the overall surface of the semiconductor substrate having the plugs 182, 184 and the interfacial cap 188A, and crystallizing the amorphous silicon layer by an annealing process. In this case, the body layer is a polysilicon layer having large-sized grains.

The channel region 196 of the thin film transistor is in a floating state. That is, since the channel region 196 of the thin film transistor is electrically isolated by the interlayer dielectric layer and the cap oxide layer 189, the voltage of the channel region 196 may be varied in accordance with the voltage applied to the source/drain regions 190A, 190B or the gate electrode 194A. The voltage variation of the channel region 196 is commonly known as the "floating body effect". Problems may arise if the floating body effect interferes with the operation of the thin film transistor, such as a kink effect and a parasitic bipolar effect, which are now explained.

When the channel region 196 is partially depleted and a high voltage is applied to the drain region, the electric field generated in the thin film transistor causes impact ionization near the drain region. Thus, if the thin film transistor is an NMOS transistor, holes generated by the impact ionization are implanted into the channel region 196, so that the channel region 196 is charged with a positive potential. The positive charges stored in the channel region 196 increase the potential of the channel region 196, thereby decreasing the threshold voltage of the thin film transistor. The decrease of the threshold voltage increases the drain current, thereby showing a kink effect in the output characteristics of the thin film transistor.

Another result caused by the charge in the channel region 196 is a turn-on of a transverse type bipolar transistor structure, which is formed from a MOS transistor, and consists of a source region, the channel region 196, and the drain region, that is, an n-p-n structure.

When the channel region 196 of the thin film transistor is biased with a positive voltage, forward bias is applied to the junction between the source region and the channel region 196 corresponding to the emitter-base junction of the transverse type n-p-n structure, and electrons are implanted from the source region to the channel region 196. The electrons implanted into the channel region 196 reach a drain depletion region to increase the drain current. As a result, the drain current is dominantly controlled by the parasitic bipolar transistor rather than by the channel current flowing under the control of the gate electrode 194A. Such a result is called a parasitic bipolar effect. The parasitic bipolar effect of the thin film transistor causes a leakage current and provides undesired results.

Therefore, methods are needed to improve the characteristics of the thin film transistor stacked on the semiconductor substrate.

SUMMARY OF THE INVENTION

The present invention is directed to provide a structure of a stack-type thin film transistor for preventing a floating body effect.

Another object of the present invention is to provide methods of fabricating stack-type thin film transistors for preventing a floating body effect.

In accordance with an exemplary embodiment, the present invention provides a semiconductor device having a body contact through a gate including a device isolation layer disposed in a predetermined portion of a semiconductor substrate, for isolating an active region. A lower gate electrode is disposed across the upper portion above the active region. A lower gate insulating layer is interposed between the lower gate electrode and the active region. A lower interlayer dielectric layer is disposed to cover the surface of the semiconductor substrate along with the lower gate electrode. A body pattern, which has a portion overlapping the lower gate electrode, is disposed on the lower interlayer dielectric layer. An upper gate electrode, which has a portion overlapping the lower gate electrode, is disposed to run across the body pattern. An upper gate insulating layer is interposed between the upper gate electrode and the body pattern. An upper interlayer dielectric layer is disposed to cover the surface of the semiconductor substrate along with the upper gate electrode. At least one body contact plug is disposed on a portion overlapping the upper gate electrode, the body pattern, and the lower gate electrode, to penetrate the upper interlayer dielectric layer, the upper gate electrode, the upper gate insulating layer, the body pattern, and the lower interlayer dielectric layer, and to be electrically connected with the lower gate electrode. As a result, the upper gate electrode is electrically connected to the body pattern through the body contact plug, and extends to be connected to the lower gate electrode.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
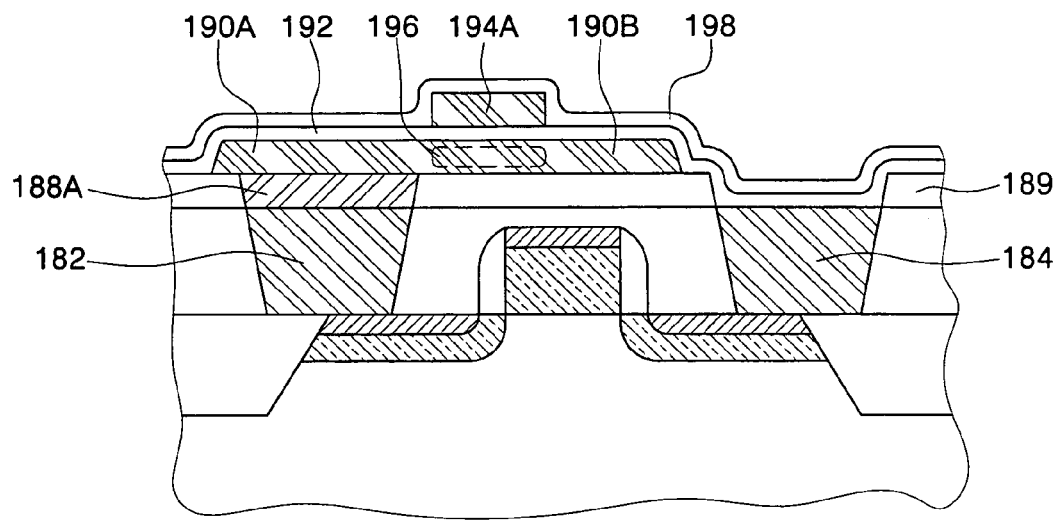
FIG. 1 is a cross-sectional view illustrating a conventional semiconductor device.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

Specifically

First, a structure of a semiconductor device having a body contact through a gate according to embodiments of the present invention will be described with reference to FIGS. 2 through 5.

Figure 2:
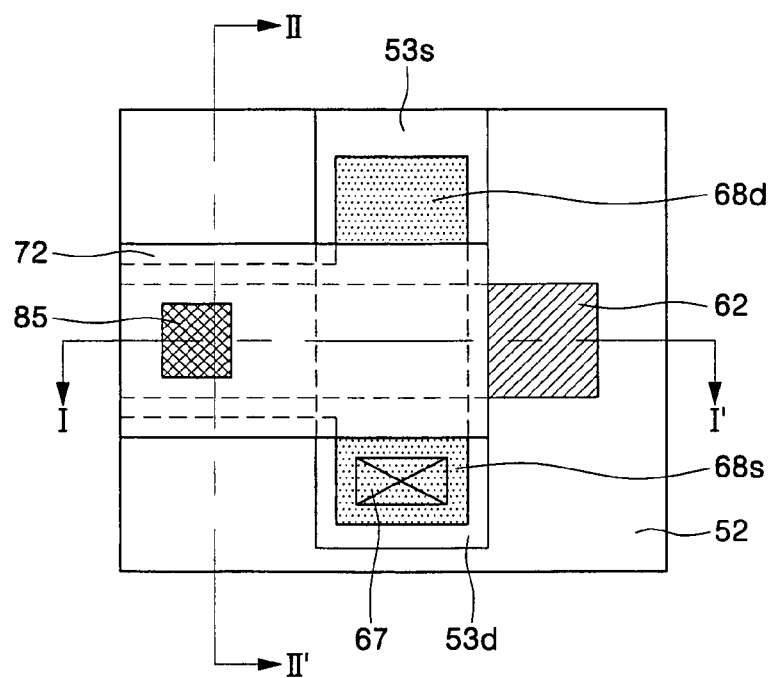
FIG. 2 is a plan view illustrating a semiconductor device having a body contact through a gate according to embodiments of the present invention.
Figure 4:
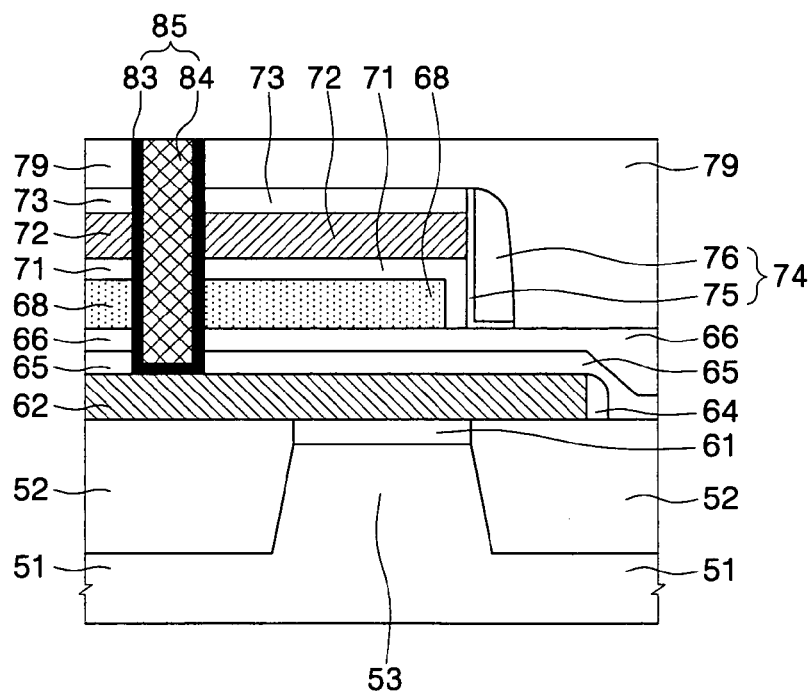
FIG. 4 is a cross-sectional view taken along the line I-I' of FIG. 2.
Figure 5:
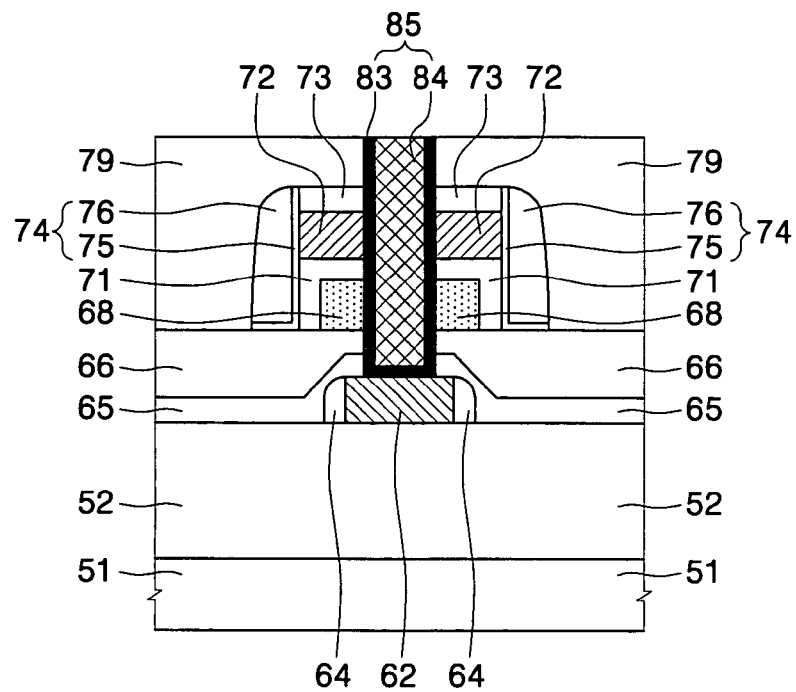
FIG. 5 is a cross-sectional view taken along the line II-II' of FIG. 2.

Referring to FIGS. 2, 4, and 5, a device isolation layer 52 is formed in a predetermined portion of a semiconductor substrate 51, thereby isolating an active region 53. A lower gate electrode 62 is disposed across the active region 53. A lower gate insulating layer 61 is interposed between the lower gate electrode 62 and the active region 53. The active region 53 includes a lower channel region under the lower gate electrode 62. One side of the active region 53 is a first lower source/drain region 53s, and the other side of the active region 53 is a second lower source/drain region 53d. The lower gate electrode 62, the first lower source/drain region 53s, and the second lower source/drain region 53d form a lower transistor.

The semiconductor substrate 51 may be a single crystal semiconductor substrate. For example, the semiconductor substrate 51 may be a single crystal silicon substrate. The device isolation layer 52 may be an insulating layer such as a high density plasma oxide layer. The lower gate electrode 62 may be composed of a conductive material such as doped polysilicon or metal silicide. The lower gate insulating layer 61 may be a thermal oxide layer. The sidewalls of the lower gate electrode 62 may be covered with lower spacers 64. The lower spacers 64 may be composed of at least one material layer selected from the group consisting of a silicon oxide layer, a silicon oxynitride layer (SiON), and a silicon nitride layer (SiN).

A lower interlayer dielectric layer 66 is formed on the overall surface of the semiconductor substrate having the lower transistor. The lower interlayer dielectric layer 66 is preferably formed of a planarized insulating material layer. Further, a lower etch stop layer 65 may be additionally interposed between the semiconductor substrate having the lower transistor and the lower interlayer dielectric layer 66. The lower etch stop layer 65 is preferably an insulating layer having an etch selectivity with respect to the lower interlayer dielectric layer 66. For example, if the lower interlayer dielectric layer 66 is a silicon oxide layer, the lower etch stop layer 65 may be a silicon nitride layer or a silicon oxynitride layer (SiON).

A body pattern 68 is disposed on the lower interlayer dielectric layer 66. Specifically, the body pattern 68 is disposed on the lower transistor, and has a portion at least partially overlapping the lower gate electrode 62. For example, the body pattern 68 is disposed across the lower gate electrode 62, and may extend to partially cover a portion above the first lower source/drain region 53s and the second lower source/drain region 53d.

Further, the body pattern 68 may be structured to be electrically connected to the second lower source/drain region 53d by a lower drain contact plug 67 penetrating the lower interlayer dielectric layer 66 and the lower etch stop layer 65. That is, the lower drain contact plug 67 may be disposed between the body pattern 68 and the second lower source/drain region 53d. The lower drain contact plug 67 may be a single crystal semiconductor plug, for example, single crystal silicon. Alternatively, the lower drain contact plug 67 may be a metal plug such as a tungsten plug. The body pattern 68 may be a single crystal or a polycrystalline semiconductor pattern. For example, if the lower drain contact plug 67 is a single crystal silicon plug, the body pattern 68 may be a single crystal silicon pattern.

An upper gate electrode 72 is disposed across the body pattern 68. An upper gate insulating layer 71 is interposed between the upper gate electrode 72 and the body pattern 68. The body pattern 68 below the upper gate electrode 72 is an upper channel region, and one side of the body pattern 68 is a first upper source/drain region 68s, and the other side of the body pattern 68 is a second upper source/drain region 68d. The upper gate electrode 72, the first upper source/drain region 68s and the second upper source/drain region 68d form an upper transistor. The first upper source/drain region 68s is connected to the second lower source/drain region 53d through the lower drain contact plug 67.

At least one portion of the upper gate electrode 72 is preferably disposed to cover an upper portion above the lower gate electrode 62. The upper gate electrode 72 may be a conductive layer such as doped polysilicon or a metal silicide.

The upper gate insulating layer 71 may be a thermal oxide layer. The sidewalls of the upper gate electrode 72 may be covered with upper spacers 74. The upper spacers 74 may be composed of at least one material layer selected from the group consisting of a silicon oxide layer, a silicon oxynitride layer (SiON), and a silicon nitride layer (SiN). For example, the upper spacers 74 may be composed of a first upper spacer 75, which is formed of a silicon oxide layer, and a second upper spacer 76, which is formed of a silicon nitride layer (SiN).

An upper interlayer dielectric layer 79 is formed on the overall surface of the semiconductor substrate having the upper transistor. The upper interlayer dielectric layer 79 is preferably composed of a planarized insulating material layer. Further, an upper etch stop layer 73 may be additionally interposed between the semiconductor substrate having the upper transistor and the upper interlayer dielectric layer 79. The upper etch stop layer 73 is preferably an insulating layer having an etch selectivity with respect to the upper interlayer dielectric layer 79. For example, if the upper interlayer dielectric layer 79 is a silicon oxide layer, the upper etch stop layer 73 may be a silicon nitride layer or silicon oxynitride layer (SiON).

A body contact plug 85 is disposed to penetrate the upper gate electrode 72 and the body pattern 68 at the region where the upper gate electrode 72, the body pattern 68, and the lower gate electrode 62 overlap. This allows an electrical connection among these elements. Specifically, the body contact plug 85 penetrates the upper interlayer dielectric layer 79, the upper etch stop layer 73, the upper gate electrode 72, the upper gate insulating layer 71, the body pattern 68, the lower interlayer dielectric layer 66, and the lower etch stop layer 65 sequentially, and is connected to the lower gate electrode 62. The body contact plug 85 may be a single plug as shown in the drawing, or may be composed of a plurality of plugs. Further, the body contact plug 85 may have the same width at its upper portion as its lower portion. Alternatively, the body contact plug 85 may have a width that changes along its length, such as an inverted trapezoidal shape, for example. Alternatively, the width may vary in steps rather than gradually.

The body contact plug 85 may be a metal layer. The metal layer may be composed of a tungsten layer 84 and a barrier metal layer 83, which covers the bottom side and the sidewalls of the tungsten layer 84. The barrier metal layer 83 may be at least one material layer selected from titanium (Ti) and titanium nitride (TiN). Alternatively, the body contact plug 85 may be composed of a metal layer such as a tungsten layer 84 only. As a result, the upper gate electrode 72 is electrically connected to the body pattern 68 through the body contact plug 85, and extends to connect to the lower gate electrode 62. Thus, the structure improves the floating body effect of the upper transistor.

Figure 3:
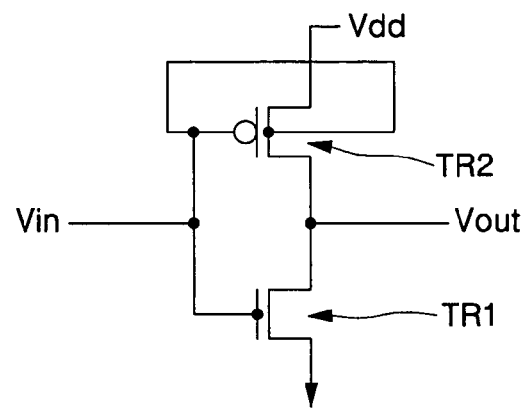
FIG. 3 is an equivalent circuit diagram of FIG. 2.

FIG. 3 is an equivalent circuit diagram illustrating the semiconductor device having a body contact through a gate as shown in FIG. 2, according to embodiments of the present invention.

Referring to FIG. 3, the source electrode of a first transistor TR1 is grounded, and the drain electrode is connected to the source electrode of a second transistor TR2. The gate electrode of the first transistor TR1 is connected to the gate electrode of the second transistor TR2, and concurrently is connected to the channel region of the second transistor TR2. The drain electrode of the second transistor TR2 is connected to a drain power source Vdd. The gate electrodes of the first transistor TR1 and the second transistor TR2, which are connected to each other, are connected to an input signal line Vin, and the source electrode of the second transistor TR2 is connected to an output signal line Vout. In the present embodiment the first transistor TR1 is an NMOS transistor, and the second transistor TR2 is a PMOS transistor, and the device as shown in the equivalent circuit diagram may operate as a typical inverter device.

The inverter device is now used to describe some advantages of some embodiments of the present invention.

The inverter device may have the first transistor TR1 and the second transistor TR2 disposed on a plane surface at the same level. However, to increase the integration density it may be advantageous to configure the inverter device so that the first transistor TR1 is disposed at a lower level and the second transistor TR2 is disposed at an upper level. However, the second transistor TR2 includes a thin film, which is composed of a single crystal or a polycrystalline semiconductor, called a "body region", on the interlayer dielectric layer. If the body region is floating, the characteristics of the second transistor TR2 may be seriously deteriorated due to the floating body effect, described earlier. Therefore, according to the present invention, the gate electrode and the channel region of the second transistor TR2 are electrically connected as shown in FIG. 3, to improve the electrical characteristics of the second transistor TR2.

Specifically, the first transistor TR1 is the lower transistor mentioned in reference to FIG. 2, and the second transistor TR2 is the upper transistor. The channel region of the second transistor TR2 exists inside the body pattern 68. That is, the upper gate electrode 72 is electrically connected to the body pattern 68 through the body contact plug 85, and extends to connect to the lower gate electrode 62. Therefore, the structure contributes to improving a floating body effect of the upper transistor.

Now hereinafter, methods of fabricating semiconductor devices having body contacts through gates according to embodiments of the present invention will be described in reference to FIGS. 2 and 4 through 14.

Figure 6:
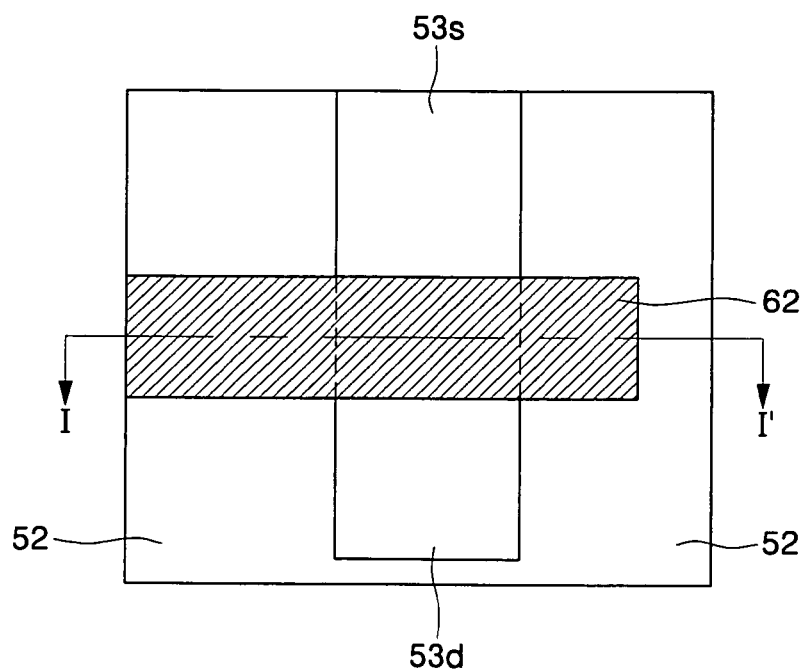
FIGS. 6, 8, 10 and 13 are plan views illustrating methods of fabricating semiconductor devices according to embodiments of the present invention.
Figure 7:
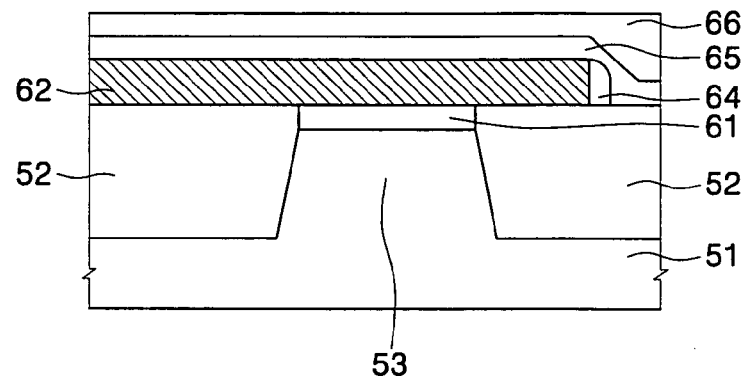
FIGS. 7, 9, 11, 12 and 14 are cross-sectional views taken along the lines I-I' of FIGS. 6, 8, 10 and 13.

Referring to FIGS. 6 and 7, a device isolation layer 52 is formed on a predetermined portion of a semiconductor substrate 51, to isolate an active region 53. A lower gate insulating layer 61 is formed on the active region 53, and a gate conductive layer is formed on the overall surface of the semiconductor substrate 51 having the lower gate insulating layer 61 formed thereon. The gate conductive layer is patterned, thereby forming a lower gate electrode 62 disposed across the active region 53. As a result, a lower channel region is formed in the active region 53 below the lower gate electrode 62, and a first lower source/drain region 53s is formed on one side of the active region 53, and a second lower source/drain region 53d is formed on the other side of the active region 53.

The device isolation layer 52 is preferably composed of a material having sufficient gate fill characteristics and sufficient isolation characteristics. For example, the device isolation layer 52 may be formed of a silicon oxide layer by a high density plasma chemical vapor deposition (HDPCVD) (hereinafter, referred to as "high density plasma oxide layer"). Since the high density plasma oxide layer is formed by performing an oxide deposition process and a sputtering etch process alternately and repeatedly, the high density plasma oxide layer is known to have excellent gap fill characteristics. The lower gate insulating layer 61 may be formed of an insulating layer such as a thermal oxide layer. The lower gate electrode 62 may be composed of a conductive material such as polysilicon or a metal silicide.

Lower spacers 64 may be formed on the sidewalls of the lower gate electrode 62. The lower spacers 64 may be formed of at least one material layer selected from the group consisting of a silicon oxide layer, a silicon oxynitride layer (SiON), and a silicon nitride layer (SiN).

A lower interlayer dielectric layer 66 is formed on the overall surface of the semiconductor substrate having the lower gate electrode 62 formed thereon. The lower interlayer dielectric layer 66 is formed of an insulating material layer, such as a high density plasma oxide layer. It is preferable to planarize the lower interlayer dielectric layer 66 using a chemical mechanical polishing (CMP) process. Before the lower interlayer dielectric layer 66 is formed, a conformal lower etch stop layer 65 may be formed. The conformal lower etch stop layer 65 is preferably formed of an insulating layer having an etch selectivity with respect to the lower interlayer dielectric layer 66. For example, if the lower interlayer dielectric layer 66 is a silicon oxide layer, the lower etch stop layer 65 may be formed of a silicon nitride layer or a silicon oxynitride layer (SiON).

Figure 8:
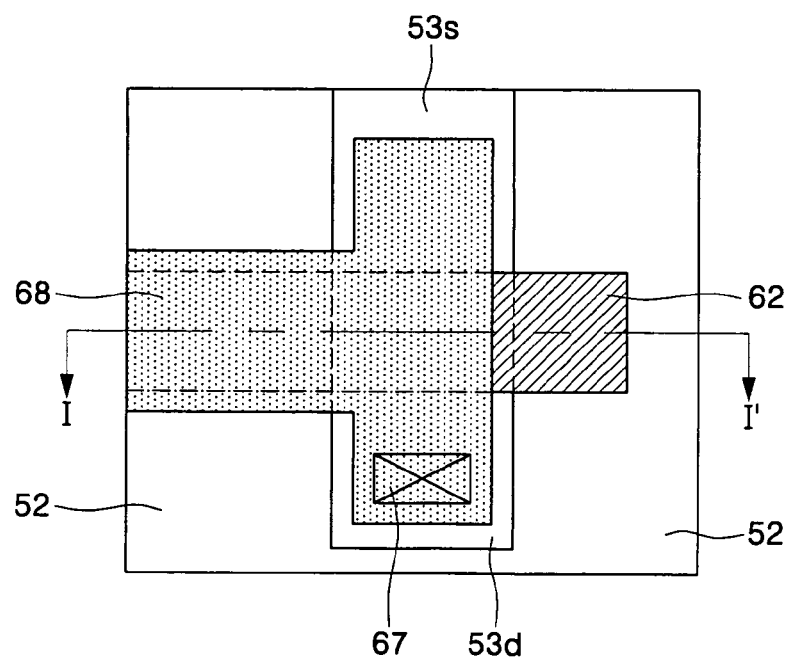
Figure 9:
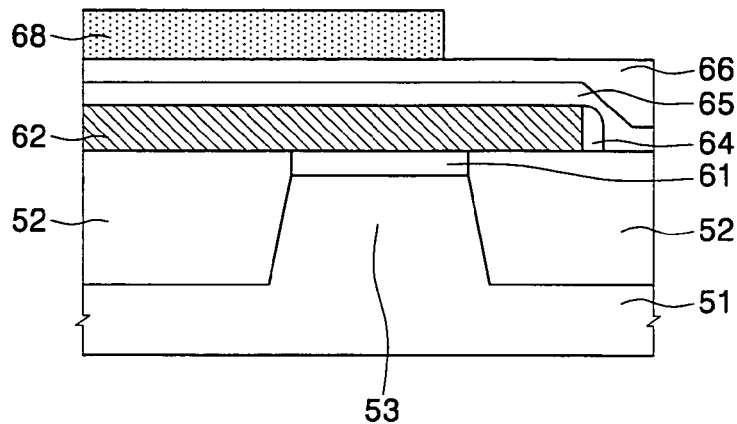

Referring to FIGS. 8 and 9, the lower interlayer dielectric layer 66 and the lower etch stop layer 65 are patterned, thereby forming a lower drain contact hole exposing the second lower source/drain region 53d. A lower drain contact plug 67 is formed inside the lower drain contact hole. The lower drain contact plug 67 is preferably formed using a selective epitaxial growth (SEG) technology. In this case, the lower drain contact plug 67 is grown to have the same crystal structure as that of the exposed second lower source/drain region 53d. For example, if the semiconductor substrate 52 is a single crystal silicon substrate, and the SEG technology is performed using a silicon source gas, the lower drain contact plug 67 is formed to have a single crystal silicon structure. The lower drain contact plug 67 may be doped to have a P-type or N-type conductivity type. Alternatively, the lower drain contact plug 67 may be formed of a metal plug, such as a tungsten plug.

A semiconductor body layer is formed on the overall surface of the semiconductor substrate having the lower drain contact plug 67 formed thereon. The semiconductor body layer may be formed of a single crystal semiconductor layer or polycrystalline semiconductor layer. The semiconductor body layer is patterned, thereby forming a body pattern 68 on the lower interlayer dielectric layer 66. The body pattern 68 is formed across the lower gate electrode 62 and to partially cover the upper portion above the first lower source/drain region 53s and the second lower source/drain region 53d, to be in contact with the lower drain contact plug 67.

Figure 10:
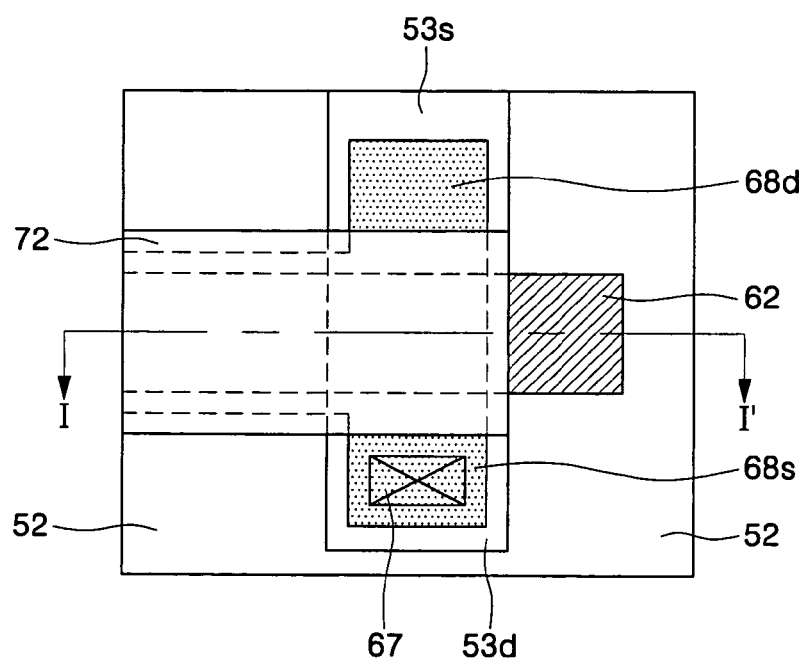
Figure 11:
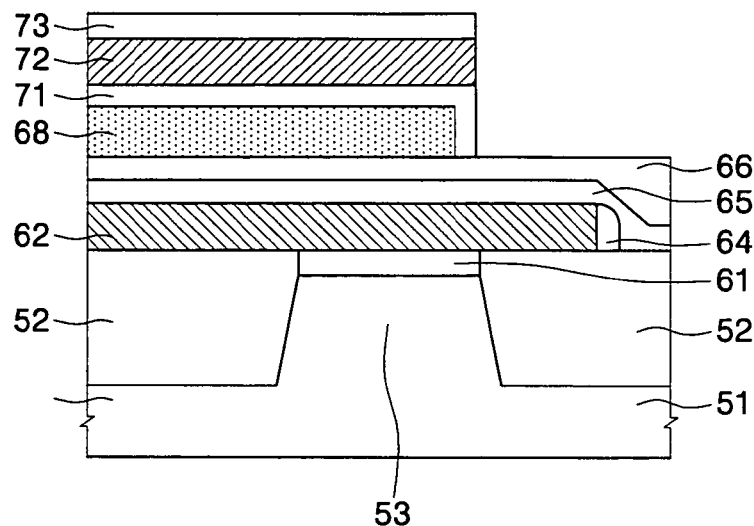
Figure 12:
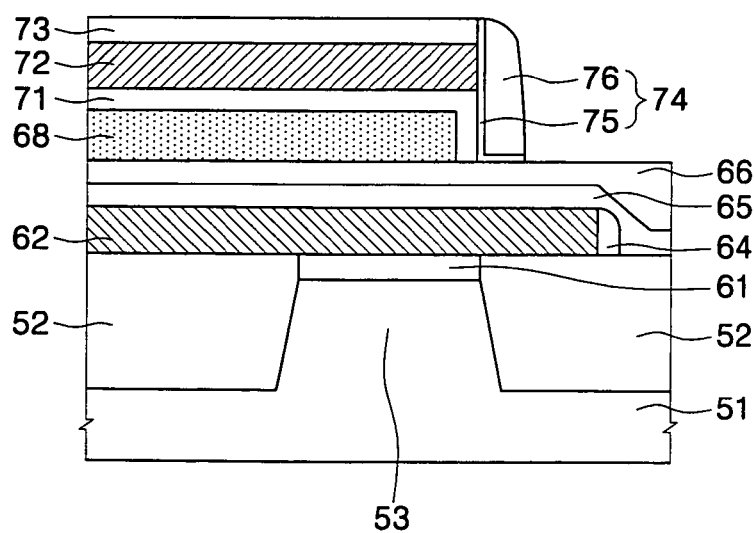

Referring to FIGS. 10, 11 and 12, an upper gate insulating layer 71 is formed on the surface of the body pattern 68. A gate conductive layer is formed on the overall surface of the semiconductor substrate having the upper gate insulating layer 71 formed thereon. The gate conductive layer may be composed of a conductive material, such as polysilicon or a metal silicide. The upper gate insulating layer 71 may be formed of an insulating layer such as a thermal oxide layer. An etch stop layer may be formed on the overall surface of the semiconductor substrate having the gate conductive layer formed thereon. The etch stop layer may be formed of a silicon nitride layer or a silicon oxynitride layer (SiON). However, the etch stop layer may be omitted. The etch stop layer and the gate conductive layer are sequentially patterned, thereby forming an upper etch stop layer 73 and an upper gate electrode 72. The upper gate electrode 72 is formed across the body pattern 68. As a result, an upper channel region is formed on the body pattern 68 below the upper gate electrode 72, and a first upper source/drain region 68s is formed on one side of the body pattern 68 and a second upper source/drain region 68d is formed on the other side of the body pattern 68. The first upper source/drain region 68s may be connected to the second lower source/drain region 53d through the lower drain contact plug 67. At least a part of the upper gate electrode 72 is preferably formed to cover the lower gate electrode 62. Upper spacers 74 may be formed on the sidewalls of the upper gate electrode 72. The upper spacers 74 may be formed of at least one material layer selected from the group consisting of a silicon oxide layer, a silicon oxynitride layer (SiON), and a silicon nitride layer (SiN). For example, the upper spacers 74 may be composed of a first upper spacer 75, which is formed of a silicon oxide layer, and a second upper spacer 76, which is formed of a silicon nitride layer (SiN).

Figure 13:
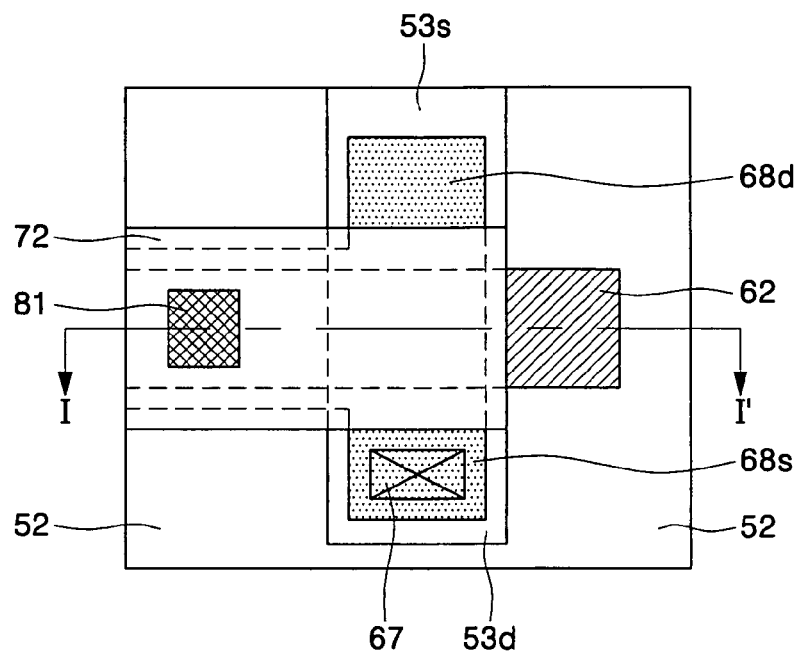
Figure 14:
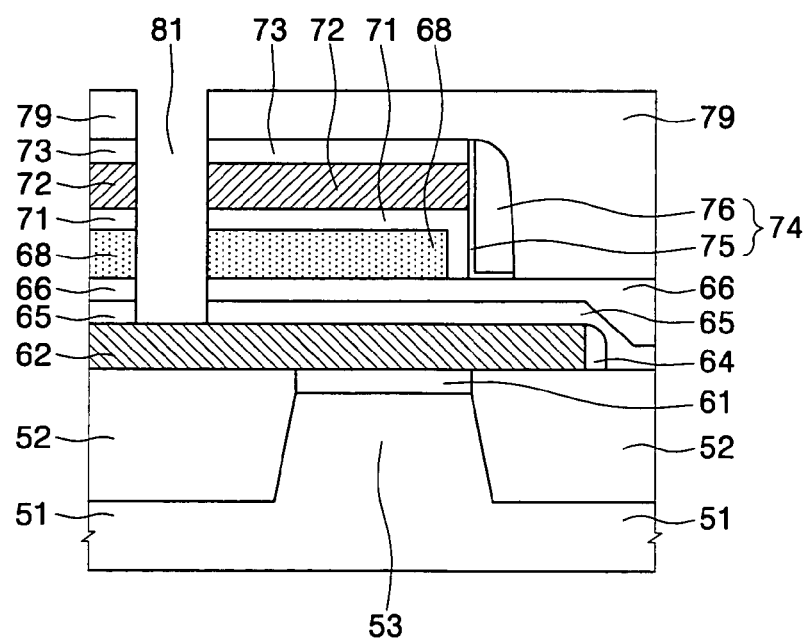

Referring to FIGS. 13 and 14, an upper interlayer dielectric layer 79 is formed on the overall surface of the semiconductor substrate having the upper gate electrode 72 formed thereon. The upper interlayer dielectric layer 79 is formed of an insulating material layer, such as a high density plasma oxide layer, which is then preferably planarized using a chemical mechanical polishing (CMP) process. Then, the upper interlayer dielectric layer 79, the upper etch stop layer 73, the upper gate electrode 72, the upper gate insulating layer 71, the body pattern 68, the lower interlayer dielectric layer 66, and the lower etch stop layer 65 are sequentially patterned, thereby forming a body contact hole 81 exposing the lower gate electrode 62. As shown in the drawing, the body contact hole 81 may be composed of a single hole, or a plurality of holes. An anisotropic etch method may be employed to form the body contact hole 81, and the anisotropic etch method may be repeatedly performed several times.

Referring to FIGS. 2, 4 and 5 again, a body contact plug 85 is formed inside the body contact hole 81. The body contact hole plug 85 may be formed by sequentially stacking a metal layer such as a tungsten layer 84, and a barrier metal layer 83, and planarizing the metal layer and the barrier metal layer 83. The barrier metal layer 83 may be formed of at least one material layer selected from titanium (Ti) or titanium nitride (TiN). Alternatively, the body contact plug 85 may be formed of only a metal layer such as the tungsten layer 84.

As a result, the upper gate electrode 72 is electrically connected to the body pattern 68 through the body contact plug 85, and extends to connect to the lower gate electrode 62.

Figure 15:
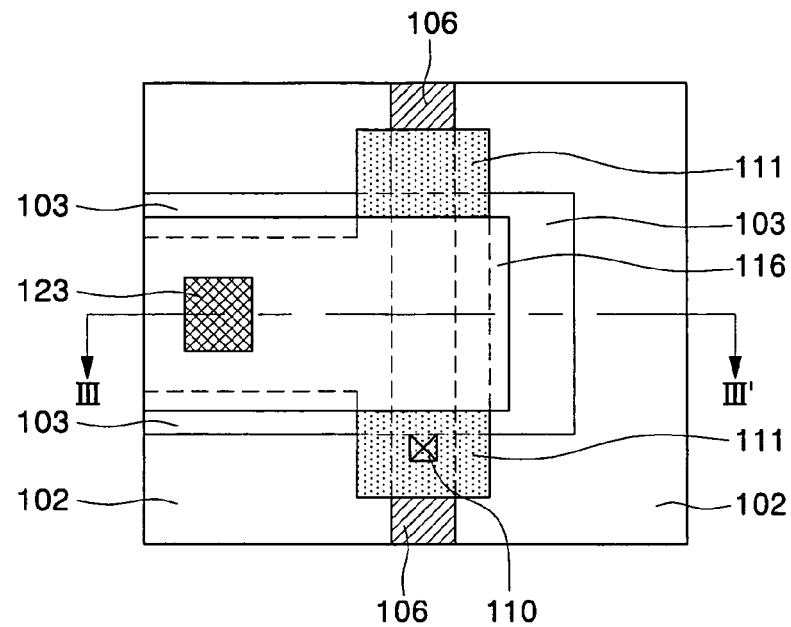
FIG. 15 is a plan view illustrating a semiconductor device having a body contact through a gate according to another embodiment of the present invention.
Figure 16:
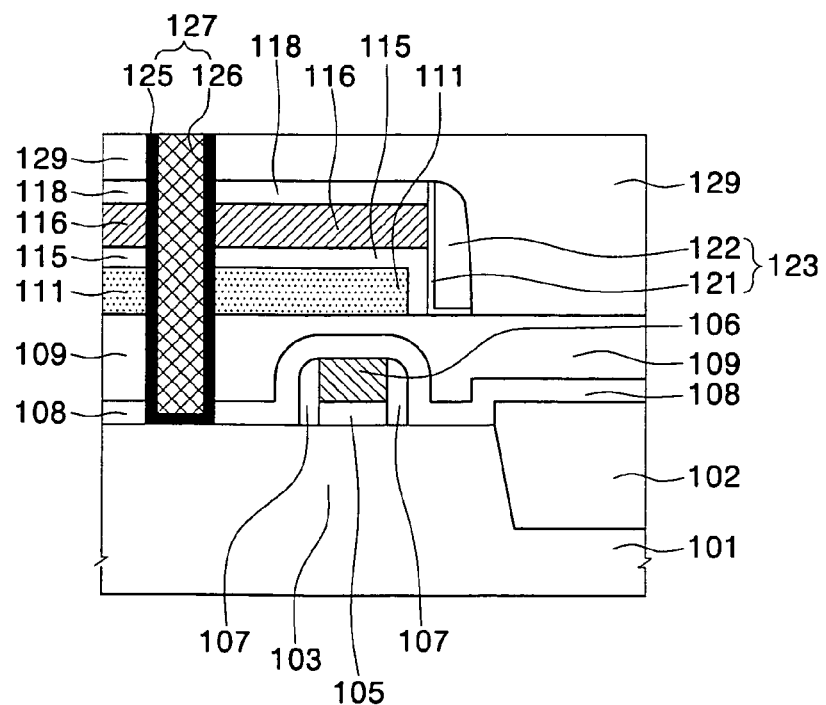
FIG. 16 is a cross-sectional view taken along the line III-III' of FIG. 15.

FIG. 15 is a plan view illustrating a semiconductor device having a body contact through a gate according to another embodiment of the present invention, and FIG. 16 is a cross-sectional view taken along a line of III-III' of FIG. 15.

Referring to FIGS. 15 and 16, a device isolation layer 102 is formed in a predetermined portion of a semiconductor substrate 101, thereby isolating an active region 103. A lower gate electrode 106 is formed across the active region 103. A lower gate insulating layer 105 is interposed between the lower gate electrode 106 and the active region 103. The active region 103 below the lower gate electrode 106 is a lower channel region, and the active region 103 on both sides of the lower channel region includes lower source/drain regions. The lower gate electrode 106 and the lower source/drain regions form a lower transistor.

The semiconductor substrate 101 may be a single crystal semiconductor substrate. For example, the semiconductor substrate 101 may be a single crystal silicon substrate. The device isolation layer 102 may be an insulating layer such as a high density plasma oxide layer. The lower gate electrode 106 may be composed of a conductive material such as polysilicon or a metal silicide. The lower gate insulating layer 105 may be an insulating layer such as a thermal oxide layer. The sidewalls of the lower gate electrode 106 may be covered with lower spacers 107. The lower spacers 107 may be formed of at least one material layer selected from the group consisting of a silicon oxide layer, a silicon oxynitride layer (SiON), and a silicon nitride layer (SiN).

A lower interlayer dielectric layer 109 is formed on the overall surface of the semiconductor substrate having the lower transistor. The lower interlayer dielectric layer 109 is preferably a planarized insulating material layer. Further, a lower etch stop layer 108 may be interposed between the semiconductor substrate having the lower transistor and the lower interlayer dielectric layer 109. The lower etch stop layer 108 is preferably formed of an insulating layer having an etch selectivity relative to the lower interlayer dielectric layer 109. For example, if the lower interlayer dielectric layer 109 is a silicon oxide layer, the lower etch stop layer 108 may be a silicon nitride layer or a silicon oxynitride layer (SiON).

A body pattern 111 is disposed on the lower interlayer dielectric layer 109. Specifically, the body pattern 111 is disposed above the lower transistor, and partially overlaps the active region 103. For example, the body pattern 111 is disposed above the lower gate electrode 106, and may extend to partially cover the upper portion above the lower source/drain regions.

Further, the body pattern 111 may have a structure to be electrically connected to the lower gate electrode 106 by a lower contact plug 110 penetrating the lower interlayer dielectric layer 109 and the lower etch stop layer 108. That is, the lower contact plug 110 may be disposed between the body pattern 111 and the lower gate electrode 106. The lower contact plug 110 may be a polycrystalline semiconductor plug, for example, a polycrystalline silicon plug. Or, the lower contact plug 110 may be a metal plug such as a tungsten plug. The body pattern 111 may be a single crystal semiconductor pattern or a polycrystalline semiconductor pattern. For example, the body pattern 111 may be a single crystal silicon pattern.

An upper gate electrode 116 is disposed across the body pattern 111. An upper gate insulating layer 115 is interposed between the upper gate electrode 116 and the body pattern 111. The body pattern 111 below the upper gate electrode 116 is an upper channel region, and the body patterns 111 on both sides of the upper channel region are upper source/drain regions. The upper gate electrode 116 and the upper source/drain regions form an upper transistor. One of the upper source/drain regions may be disposed to connect with the lower gate electrode 106 through the lower contact plug 110.

At least a part of the upper gate electrode 116 is preferably disposed to cover a part of one of the lower source/drain regions. That is, one selected from the lower source/drain regions disposed inside the active region 103, the body pattern 111, and the upper gate electrode 116 may have at least one portion partially overlapping each other. The upper gate electrode 116 may be a conductive material, such as polysilicon or a metal silicide. The upper gate insulating layer 115 may be an insulating layer such as a thermal oxide layer. The sidewalls of the upper gate electrode 116 may be covered with upper spacers 123. The upper spacers 123 may be formed of at least one material layer selected from the group consisting of a silicon oxide layer, a silicon oxynitride layer (SiON), and a silicon nitride layer (SiN). For example, the upper spacers 123 may be composed of a first upper spacer-I 21, which is formed of a silicon oxide layer, and a second upper spacer 122, which is formed of a silicon nitride layer (SiN).

An upper interlayer dielectric layer 129 is formed on the overall surface of the semiconductor substrate having the upper transistor. The upper interlayer dielectric layer 129 is preferably formed of a planarized insulating material layer. Further, an upper etch stop layer 118 may be interposed between the semiconductor substrate having the upper transistor, and the upper interlayer dielectric layer 129. The upper etch stop layer 118 is preferably formed of an insulating layer having an etch selectivity with respect to the upper interlayer dielectric layer 129. For example, if the upper interlayer dielectric layer 129 is a silicon oxide layer, the upper etch stop layer 118 may be a silicon nitride layer or a silicon oxynitride layer (SiON).

A body contact plug 127 is disposed to penetrate the upper gate electrode 116 and the body pattern 111 at the region where the upper gate electrode 116, the body pattern 111, and the active region 103 overlap, to electrically connect to the active region 103. Specifically, the body contact plug 127 penetrates the upper interlayer dielectric layer 129, the upper etch stop layer 118, the upper gate electrode 116, the upper gate insulating layer 115, the body pattern 111, the lower interlayer dielectric layer 109, and the lower etch stop layer 108 sequentially, and connects to a selected one of the lower source/drain regions disposed inside the active region 103. The body contact plug 127 may be a single plug as shown in the drawing, or may be composed of a plurality of plugs. Further, the body contact plug 127 may have the same width at its upper portion as its lower portion. Alternatively, the body contact plug 127 may have an upper width greater than its lower width. This width may vary smoothly or stepwise.

The body contact plug 127 may be a metal layer. The metal layer may be composed of a tungsten layer 126 and a barrier metal layer 125, which covers the bottom side and the sidewalls of the tungsten layer 126. The barrier metal layer 125 may be at least one material layer selected from titanium (Ti) and titanium nitride (TiN). Alternatively, the body contact plug 127 may be composed of only the metal layer such as the tungsten layer 126. As a result, the upper gate electrode 116 is electrically connected to the body pattern 111 through the body contact plug 127, and extends to connect to either one selected from the lower source/drain regions disposed inside the active region 103. Thus, the structure provides the result of improving the floating body effect of the upper transistor.

Now hereinafter, methods of fabricating semiconductor devices having body contacts through gates according to another embodiment of the present invention will be described in reference to FIGS. 15 and 16.

Referring to FIGS. 15 and 16, a device isolation layer 102 is formed in a predetermined portion of a semiconductor substrate 101, thereby isolating an active region 103. In the same manner described in reference to FIGS. 6 and 7, a lower gate insulating layer 105, a lower gate electrode 106, lower spacers 107, a lower etch stop layer 108, and a lower interlayer dielectric layer 109 are formed. As a result, a lower channel region is formed in the active region 103 below the lower gate electrode 106, and lower source/drain regions are formed inside the active region 103 on both sides of the lower channel region.

The lower interlayer dielectric layer 109 and the lower etch stop layer 108 are patterned, thereby forming a lower contact hole exposing the lower gate electrode 106. A lower contact plug 110 is formed inside the lower contact hole. The lower contact plug 110 may be formed using a selective epitaxial growth technology. In this case, the lower contact plug 110 is grown to have the same crystal structure as that of the exposed lower gate electrode 106. Further, the lower contact plug 110 may be formed of a metal plug such as a tungsten plug.

A semiconductor body layer is formed on the overall surface of the semiconductor substrate having the lower contact plug 110 formed thereon. The semiconductor body layer may be formed of a single crystal semiconductor layer or a polycrystalline semiconductor layer. The semiconductor body layer is patterned, thereby forming a body pattern 111 on the lower interlayer dielectric layer 109. The body pattern 111 is formed to partially cover the upper portion above the lower gate electrode 106 and the upper portion above the lower source/drain regions formed inside the active region 103, and to be in contact with the lower contact plug 110.

An upper gate insulating layer 115 is formed on the surface of the body pattern 111. The upper gate insulating layer 115 may be formed of an insulating layer such as a thermal oxide layer. A gate conductive layer is formed on the overall surface of the semiconductor substrate having the upper gate insulating layer 115 formed thereon. The gate conductive layer may be composed of a conductive material such as polysilicon or metal silicide. An etch stop layer is formed on the overall surface of the semiconductor substrate having the gate conductive layer formed thereon. However, the etch stop layer may be omitted. The etch stop layer and the gate conductive layer are sequentially patterned, thereby forming an upper etch stop layer 118 and an upper gate electrode 116. As a result, an upper channel region is formed in the body pattern 111 below the upper gate electrode 116. Upper source/drain regions are formed in the body patterns 111 on the both sides of the upper channel region. One of the upper source/drain regions is connected to the lower gate electrode 106 through the lower contact plug 110. At least a part of the upper gate electrode 116 is preferably formed to cover a portion of either one region selected from the lower source/drain regions. That is, one selected from the lower source/drain regions disposed inside the active region 103, the body pattern 111, and the upper gate electrode 116 is formed to have at least a partially overlapping portion.

Upper spacers 123 may be formed on the sidewalls of the upper gate electrode 116. The upper spacers 123 may be formed of at least one material layer selected from the group consisting of a silicon oxide layer, a silicon oxynitride layer (SiON), and a silicon nitride layer (SiN). For example, the upper spacers 123 may be composed of a first upper spacer 121, which is formed of a silicon oxide layer, and a second upper spacer 122, which is formed of a silicon nitride layer (SiN).

An upper interlayer dielectric layer 129 is formed on the overall surface of the semiconductor substrate having the upper gate electrode 116 formed thereon. The upper interlayer dielectric layer 129 is formed of an insulating material layer, such as a high density plasma oxide layer, and is preferably planarized by a CMP process. Then, the upper interlayer dielectric layer 129, the upper etch stop layer 118, the upper gate electrode 116, the upper gate insulating layer 115, the body pattern 111, the lower interlayer dielectric layer 109, and the lower etch stop layer 108 are sequentially patterned, thereby forming a body contact hole exposing one region selected from the lower source/drain regions disposed inside the active region 103. The body contact hole may be composed of only one hole, or a plurality of holes. An anisotropic etch method may be employed to form the body contact hole, and the anisotropic etch method may be repeatedly performed several times.

A body contact plug 127 is formed inside the body contact hole. The body contact plug 127 may be formed by sequentially stacking a metal layer such as a tungsten layer 126, and a barrier metal layer 125, and planarizing the metal layer and the barrier metal layer 125. The barrier metal layer 125 may be formed of at least one material layer selected from titanium (Ti) and titanium nitride (TiN). Alternatively, the body contact plug 127 may be formed of only a metal layer such as the tungsten layer 126.

As a result, the upper gate electrode 116 is electrically connected to the body pattern 111 through the body contact plug 127, and extends to connect with one region selected from the lower source/drain regions disposed inside the active region 103.

As described above, according to the present invention, a lower transistor is formed on a semiconductor substrate, and an upper thin film transistor is formed on the lower transistor. A body contact plug is formed to penetrate an upper gate electrode of the upper thin film transistor and a body pattern, and to electrically connect with a lower gate electrode of the lower transistor. Further, since the body contact plug uses a contact hole to apply an electrical signal to the upper gate electrode of the upper thin film transistor, additional volume is not necessary. Resultingly, since the upper gate electrode is electrically connected to the body pattern through the body contact plug, the floating body effect of the upper thin film transistor can be improved. Therefore, a semiconductor device is provided with the high performance required to realize a highly-integrated semiconductor device.

What is claimed is:

1. A method of fabricating a semiconductor device comprising:
    forming a lower gate electrode on a semiconductor substrate;
    forming a lower interlayer dielectric layer to cover the surface of the semiconductor substrate along with the lower gate electrode;
    forming a body pattern having a portion overlapping the lower gate electrode, on the lower interlayer dielectric layer;
    forming an upper gate electrode across the body pattern, and having a portion overlapping the lower gate electrode with an intervening insulating layer between the upper and the lower gate electrodes;
    forming a source/drain region in the body pattern so that the body pattern is provided between the upper gate electrode and the lower interlayer dielectric layer;
    forming an upper interlayer dielectric layer to cover the surface of the semiconductor substrate along with the upper gate electrode;
    forming at least one body contact hole penetrating the upper interlayer dielectric layer, the upper gate electrode, the body pattern, and the lower interlayer dielectric layer, thereby exposing the lower gate electrode; and
    forming a body contact plug filling the body contact hole, wherein the body contact plug is not in contact with the source/drain region.

2. The method according to claim 1, further comprising forming a lower etch stop layer between the lower gate electrode and the lower interlayer dielectric layer.

3. The method according to claim 2, wherein the lower etch stop layer is formed of a silicon nitride layer or a silicon oxynitride layer (SiON).

4. The method according to claim 1, wherein the lower interlayer dielectric layer is formed of a high density plasma oxide layer covering the overall surface of the semiconductor substrate, and the high density plasma oxide layer is planarized using a chemical mechanical polishing process.

5. The method according to claim 1, wherein the body pattern is composed of a single crystal semiconductor pattern or a polycrystalline semiconductor pattern.

6. The method according to claim 1, wherein the upper gate electrode is composed of polysilicon or a metal silicide.

7. The method according to claim 1, further comprising forming upper spacers on the sidewalls of the upper gate electrode.

8. The method according to claim 7, wherein the upper spacers are formed of at least one material layer selected from the group consisting of a silicon oxide layer, a silicon oxynitride layer (SiON), and a silicon nitride layer (SiN).

9. The method according to claim 1, wherein the body contact plug is formed of tungsten.

10. The method according to claim 1, wherein the body contact plug is composed of a tungsten layer and a barrier metal layer surrounding the tungsten layer.

11. The method according to claim 10, wherein the barrier metal layer is formed of at least one material layer selected from titanium (Ti) or titanium nitride (TiN).

12. A method of fabricating a semiconductor device comprising:
   forming a device isolation layer disposed in a predetermined portion of a semiconductor substrate, for isolating an active region;
   forming a lower interlayer dielectric layer covering the active region and the device isolation layer;
   forming a body pattern having a portion overlapping the active region, and disposed on the lower interlayer dielectric layer;
   forming an upper gate electrode disposed on the body pattern, and having a portion overlapping the active region, with an intervening insulating layer between the upper and the active region;
   forming a source/drain region in the body pattern so that the body pattern is provided between the upper gate electrode and the lower interlayer dielectric layer;
   forming an upper interlayer dielectric layer to cover the surface of the semiconductor substrate along with the upper gate electrode;
   forming at least one body contact hole penetrating the upper interlayer dielectric layer, the upper gate electrode, the body pattern, and the lower interlayer dielectric layer, thereby exposing the active region; and
   forming a body contact plug filling the body contact hole, wherein the body contact plug is not in contact with the source/drain region.

13. The method according to claim 12, further comprising:
   forming a lower gate insulating layer on the active region;
   forming a lower gate electrode across the active region; and
   forming a lower etch stop layer covering the surface of the semiconductor substrate along with the lower gate electrode.

14. The method according to claim 13, wherein the lower etch stop layer is formed of a silicon nitride layer or a silicon oxynitride layer (SiON).

15. The method according to claim 12, wherein the lower interlayer dielectric layer is formed of a high density plasma oxide layer covering the surface of the semiconductor substrate, and the high density plasma oxide layer is planarized using a chemical mechanical polishing process.

16. The method according to claim 12, wherein the body pattern is composed of a single crystal semiconductor pattern or a polycrystalline semiconductor pattern.

17. The method according to claim 12, wherein the body contact plug is formed of tungsten.

18. The method according to claim 12, wherein the body contact plug is composed of a tungsten layer and a barrier metal layer surrounding the tungsten layer.

19. A method of fabricating a semiconductor device comprising:
   forming a body pattern on a semiconductor substrate;
   forming a gate electrode on the body pattern;
   forming a source/drain region in the body pattern so that the body pattern is provided between the gate electrode and the semiconductor substrate; and
   forming a body contact plug penetrating the gate electrode and the body pattern, wherein the body contact plug is not in contact with the source/drain region, and further comprising:
      forming a lower dielectric layer between the semiconductor substrate and the body pattern;
      forming an upper dielectric layer to cover the surface of the semiconductor substrate along with the gate electrode; and
      forming at least one body contact hole penetrating the upper dielectric layer, the gate electrode, the body pattern, and the lower dielectric layer.

20. The method according to claim 19, wherein the body contact plug is in contact with the gate electrode, the body pattern, and the semiconductor substrate.

21. The method according to claim 19, further comprising, forming a lower gate electrode between the semiconductor substrate and the lower dielectric layer to have a portion overlapping the body pattern, wherein the body contact plug is in contact with the gate electrode, the body pattern, and the lower gate electrode.

* * * * *

UNITED STATES PATENT AND TRADEMARK OFFICE
CERTIFICATE OF CORRECTION

PATENT NO. : 7,473,590 B2  Page 1 of 1
APPLICATION NO. : 11/177447
DATED : January 6, 2009
INVENTOR(S) : Jae-Hun Jeong et al.

It is certified that error appears in the above-identified patent and that said Letters Patent is hereby corrected as shown below:

Column 9, line 60, the words "spacer-I 21" should read --spacer 121--.

Signed and Sealed this

Thirteenth Day of July, 2010

David J. Kappos
*Director of the United States Patent and Trademark Office*